US007609586B2

(12) United States Patent
Osborn et al.

(10) Patent No.: US 7,609,586 B2
(45) Date of Patent: Oct. 27, 2009

(54) ACOUSTIC PROJECTOR HAVING MINIMIZED MECHANICAL STRESSES

(75) Inventors: Jason W. Osborn, Amherst, NH (US); Matthew M. DeAngelis, Bedford, NH (US)

(73) Assignee: BAE Systems Information And Electronic Systems Integration Inc., Nashua, NH (US)

(*) Notice: Subject to any disclaimer, the term of this patent is extended or adjusted under 35 U.S.C. 154(b) by 673 days.

(21) Appl. No.: 10/542,993

(22) PCT Filed: Oct. 12, 2004

(86) PCT No.: PCT/US2004/033628

§ 371 (c)(1),
(2), (4) Date: Jul. 20, 2005

(87) PCT Pub. No.: WO2005/062667

PCT Pub. Date: Jul. 7, 2005

(65) Prior Publication Data

US 2008/0219101 A1 Sep. 11, 2008

Related U.S. Application Data

(60) Provisional application No. 60/529,444, filed on Dec. 12, 2003.

(51) Int. Cl.
*H04R 17/00* (2006.01)
*H01L 41/08* (2006.01)

(52) U.S. Cl. ....................... 367/169; 367/159; 367/165; 367/176; 310/337

(58) Field of Classification Search ................. 367/159, 367/162, 165, 169, 176; 310/337
See application file for complete search history.

(56) References Cited

U.S. PATENT DOCUMENTS

| | | | | |
|---|---|---|---|---|
| 4,220,887 | A | 9/1980 | Kompanek | |
| 4,651,044 | A | 3/1987 | Kompanek | |
| 4,821,244 | A | 4/1989 | Wood | |
| 4,941,202 | A * | 7/1990 | Upton | 367/165 |
| 5,020,035 | A | 5/1991 | Kompanek | |
| 5,103,130 | A * | 4/1992 | Rolt et al. | 310/337 |
| 5,122,992 | A | 6/1992 | Kompanek | |
| 5,126,979 | A | 6/1992 | Rowe, Jr. et al. | |
| 5,321,333 | A * | 6/1994 | Walden et al. | 367/159 |
| 5,592,359 | A | 1/1997 | Kompanek | |
| 5,805,529 | A | 9/1998 | Purcell | |
| 5,926,439 | A | 7/1999 | Piquette | |
| 5,949,741 | A | 9/1999 | Piquette | |
| 6,069,845 | A * | 5/2000 | Ambs | 367/165 |
| RE37,204 | E | 6/2001 | Kompanek | |
| 6,491,095 | B2 | 12/2002 | Kompanek | |
| 6,496,448 | B1 | 12/2002 | Kompanek | |
| 6,535,459 | B1 | 3/2003 | Hutton et al. | |
| 6,545,949 | B1 | 4/2003 | Franklin | |
| 6,567,342 | B1 | 5/2003 | Purcell et al. | |
| 6,567,343 | B1 | 5/2003 | Purcell et al. | |
| 6,584,039 | B1 | 6/2003 | Purcell et al. | |
| 6,643,222 | B2 | 11/2003 | Osborn et al. | |
| 6,649,069 | B2 | 11/2003 | DeAngelis | |

* cited by examiner

*Primary Examiner*—Ian J Lobo
(74) *Attorney, Agent, or Firm*—Sand & Sebolt; Michael Sand; Daniel J. Long

(57) ABSTRACT

An acoustic projector which includes an outer shell (8) formed of a reinforced epoxy resin having a longitudinal slot (14) has an inner reinforcing liner (20) formed of metal to reduce stress. The liner (20) extends throughout the length of the outer shell and has a longitudinal slot (22) aligned with the slot (14) formed in the shell (8). An arcuate shaped driver (10) is mounted along a portion of the I.D. of the metal liner (20) and separated therefrom by insulation (24).

15 Claims, 3 Drawing Sheets

ACOUSTIC PROJECTOR HAVING MINIMIZED MECHANICAL STRESSES

CROSS REFERENCE TO RELATED APPLICATION

This application claims the benefit of U.S. provisional application Ser. No. 60/529,444, filed Dec. 12, 2003.

BACKGROUND OF THE INVENTION

1. Field of the Invention

The present invention relates to underwater acoustics and more particularly to acoustic projectors. Even more particularly, the invention relates to an acoustic projector having increased mechanical strength by the addition of a metallic liner and/or a reinforced outer shell formed of epoxy graphite layers.

2. Brief Description of Prior Developments

In the deployment of low frequency underwater acoustic projectors effective management of mechanical stresses within the radiating device are a critical design issue that must be addressed to ensure successful operations over a wide range of depths and acoustic dynamic range. One of the stresses most difficult to manage is the z-axis stress or stress along the length of the projector. This stress is particularly difficult to manage when these devices use a filament wound composite shell component to serve as the primary mechanical structure within the radiating device.

The prior art method of slotted cylinder projector design was to concentrate on achieving high hoop modulus (circumference modulus) of a graphite/epoxy shell. In the winding process the manufacturer achieves high hoop modulus by having a wind angle, near 90 degrees, which reduced the z-axis modulus (in the length direction)

Having a reduced Z-axis modulus means the stiffness in the z-direction is reduced and thus during operation and depth excursion, the stress in that direction are increased. Not adhering to reduced dynamic range and depth could result in mechanical failure. For typical slotted cylinder projector operation and size limits, this increased stress reduces the depth and dynamic range capability of the slotted Cylinder projector.

A need, therefore, exists for an acoustic projector construction in which mechanical stresses are minimized so as to increase depth performance and dynamic range.

SUMMARY OF INVENTION

To solve this problem the acoustic projector shell can be assembled with a metallic liner along the internal diameter (ID) of the shell. This metallic liner provides increased stiffness in the Z-axis direction (along the axial length of the projector), which reduces stress. The metallic liner can be any metal, such as aluminum, steel, titanium, brass, etc. An additional method of increasing the Z-axis stiffness (modulus) is to change the wind angle, or introduce longitudinal fibers along the length of a graphite/epoxy or other composite type, filament wound shell. The one advantage the metallic liner has over the composite wound solution, entailing longitudinal fibers or wind angle change, is that the shell can be any material and the modulus in the hoop direction (circumference) is unchanged, thus the resonance or tuned frequency of operation is unchanged.

In the method and apparatus of this invention, a slotted cylinder projector graphite/epoxy shell, which includes a metallic liner or increased graphite stiffness in the z direction, reduces stress in the projector along the z direction, which significantly increases the depth of operation and dynamic range of the projector. These improvements can be made without sacrificing other performance metrics, such as bandwidth, source level or efficiency.

BRIEF DESCRIPTION OF THE DRAWINGS

The present invention is further described with reference to the accompanying drawings wherein.

Similar numbers refer to similar parts throughout the drawings.

DETAILED DESCRIPTION OF THE PREFERRED EMBODIMENT

Figures 1, 2:
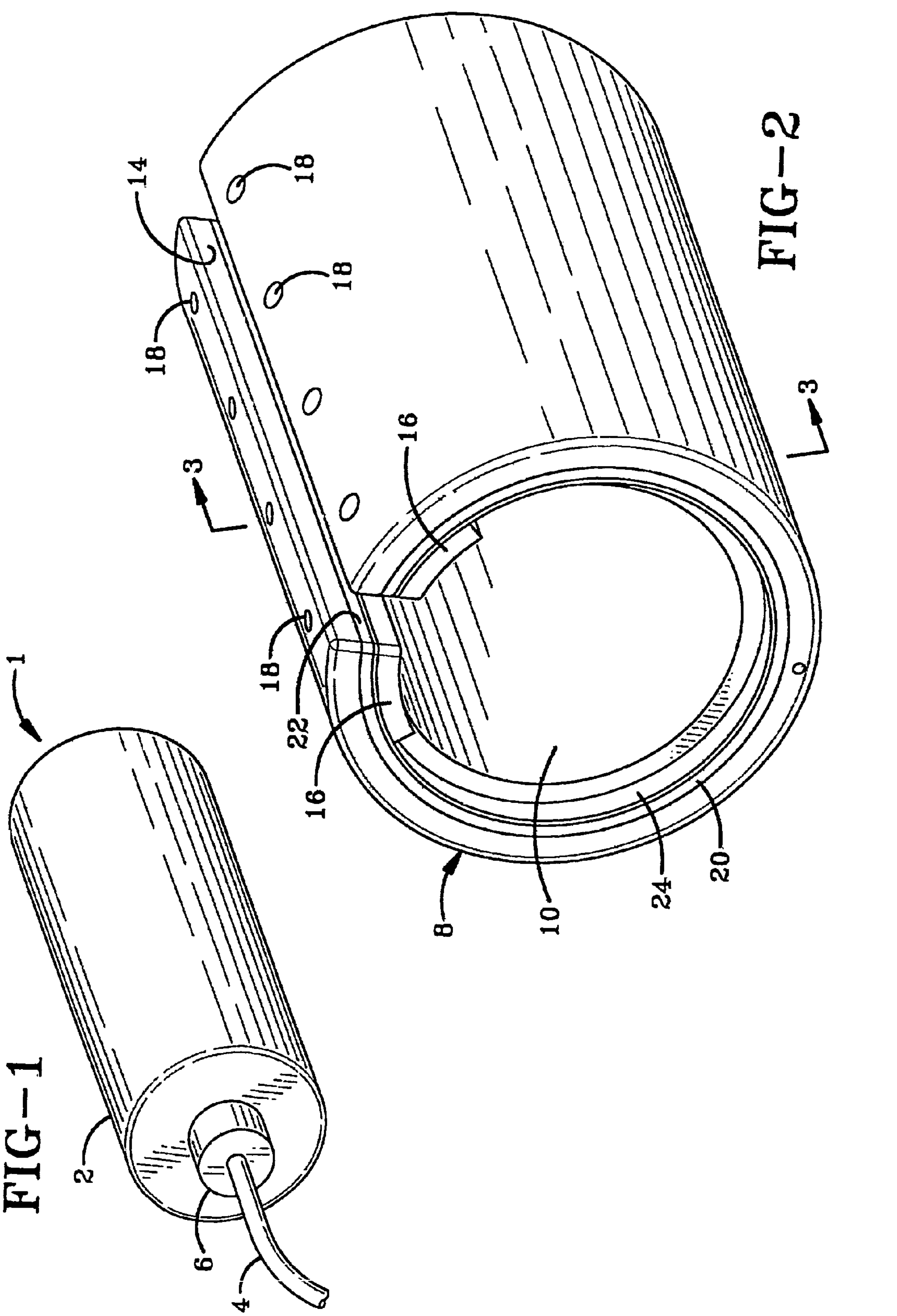
FIG. 1 is a perspective view of an acoustic projector with the improved shell segment incorporated therein.
FIG. 2 is a perspective view of a preferred embodiment of a single shell segment of the acoustic projector of the presentation.
Figure 3:
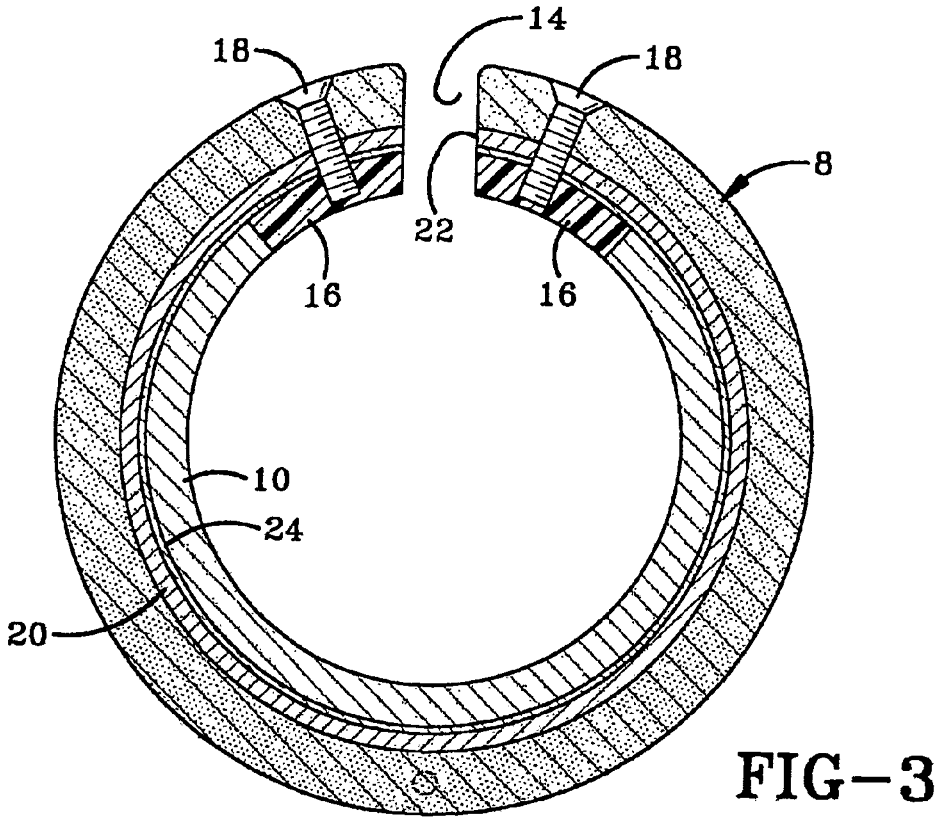
FIG. 3 is a cross-sectional view taken on line 3-3, FIG. 2.

The improvements to the construction of the slotted cylinder or outer shell to reduce mechanical stress requires either the addition of a metallic liner to the inner diameter of the shell or the forming of the shell by a plurality of overlapping angled strips formed of an epoxy/graphite composition. FIG. 2 shows an isometric drawing of an assembled shell segment that has a metallic liner on the inner diameter of the graphite epoxy shell. FIG. 3 shows a cross section of the shell segment having the metallic liner on the inner diameter of the graphite/epoxy shell. This liner covers the entire length of the shell and covers the complete inner diameter of the shell. The metallic liner is usually placed between the inner diameter of the shell and the outer diameter of an insulation material. The metallic liner can be of various metallic material, such as steel, aluminum, titanium, brass, etc.

Figure 4:
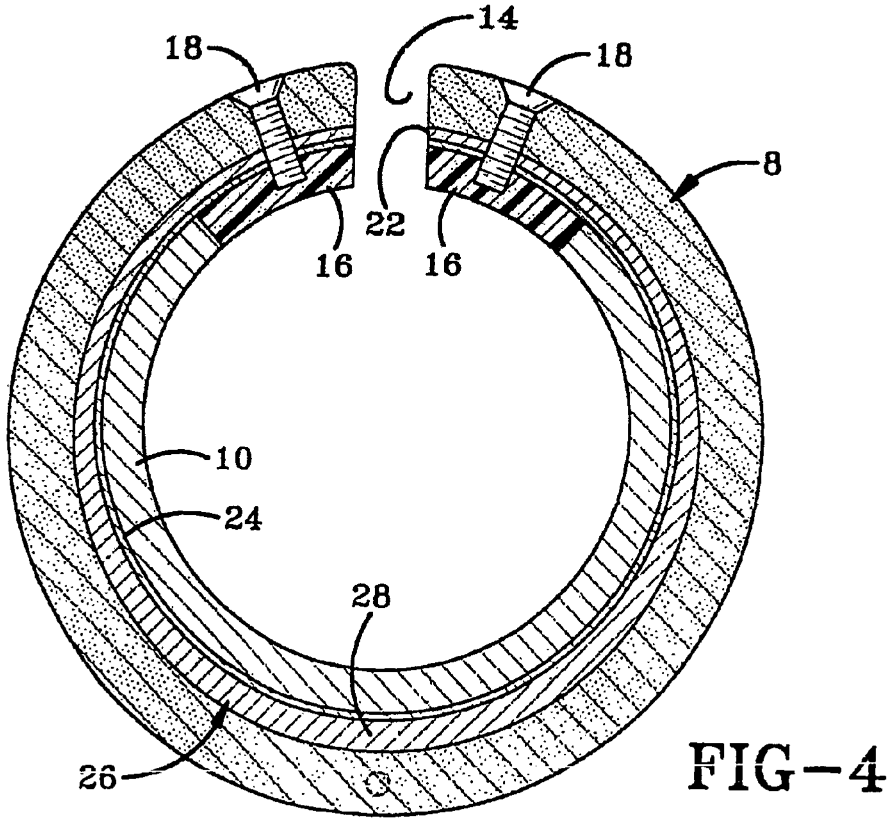
FIG. 4 is a vertical cross section of an alternate embodiment of the metallic liner mounted in the acoustic projection of the present invention.

The stiffness of the material used for the metallic liner as well as the thickness of that liner, controls the stiffness in the z or axial direction of the projector. The liner material and thickness can also be changed to adjust the resonance frequency and bandwidth of the projector. Additionally, the metallic liner does not have to be of uniform thickness in the hoop or circumferential direction. A tapered liner can provide needed stiffness near the node (opposite the slot), while being tapered toward the slot to reduce weight and effects on acoustic performance, as shown in FIG. 4. An optimal design would be the inclusion of the metallic liner with no negative effects, perhaps improving effects on the acoustic response, a significant increase in operation and survival depth capabilities, as well as an increase in dynamic range capability.

Figure 5:
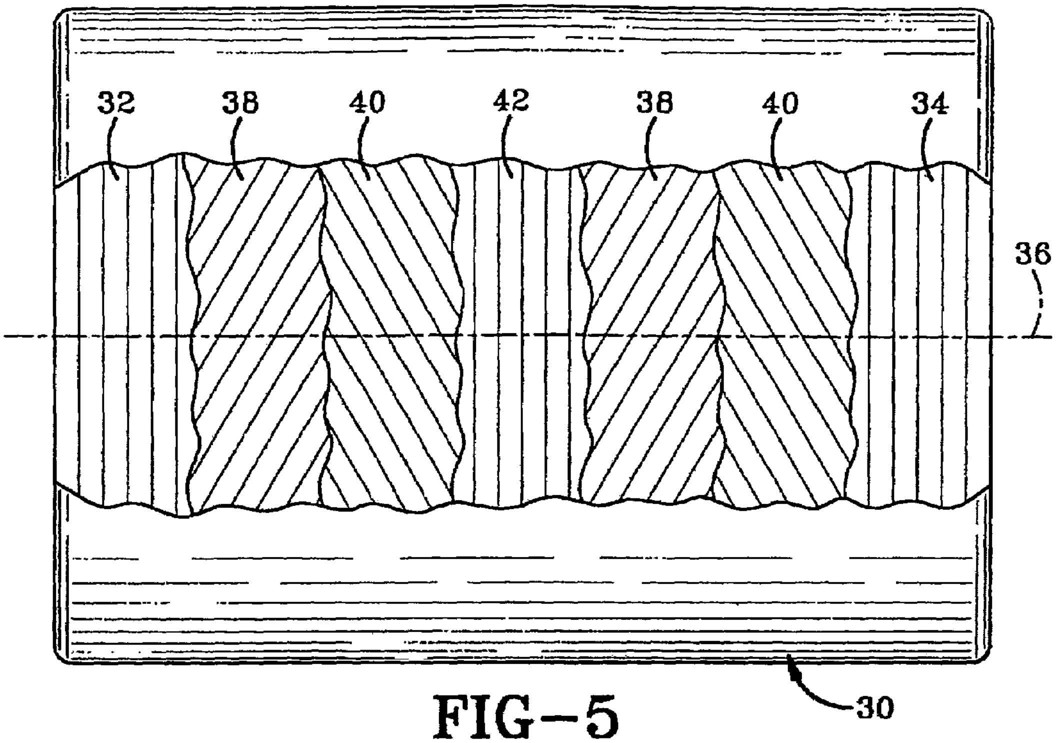
FIG. 5 is a cut-away view of a modified shell segment formed with overlapping angled epoxy/graphite strips.

As with the metallic liner, adjusting the graphic/epoxy shell wind angle and fiber content as shown in FIG. 5 can also adjust the stiffness in the Z or axial direction. Methods for adjusting the modulus of the axial direction are well known by those familiar with graphite (composite) tube manufacture. These methods include reducing the wind angle, such that a higher percentage of fiber is in the axial direction, during the winding process. An additional method of achieving higher axial stiffness is to lay high modulus fibers, in the axial direction, between the winding layer.

A disadvantage of using the graphite wind technique to change the modulus, versus adding a metallic liner, is that the hoop or circumferential direction modulus will always be effected. In most cases the hoop modulus will be reduced when the axial modulus is increased. This reduction in the hoop direction modulus has undesirable effects on the depth of operation of the slotted cylinder projector because the shell modulus and strength are the primary support structure of the projector. Additionally, when the hoop modulus decreases the resonance also decreases and thus to maintain acoustic and depth performance additional shell thickness may be needed.

Figure 6:
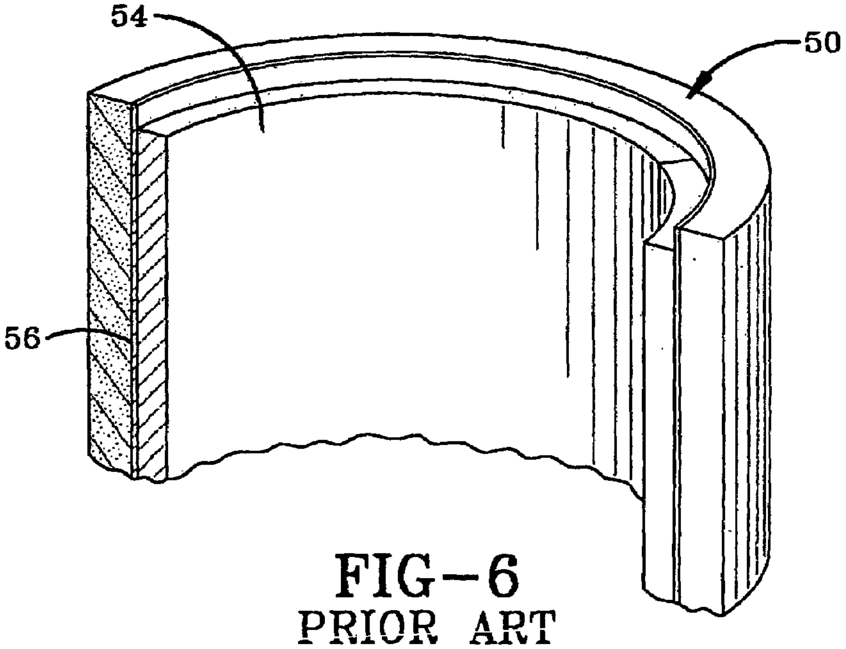
FIG-6 PRIOR ART
FIG. 6 is a fragmentary perspective view of a prior art non-reinforced shell segment.

The improved construction and method of slotted cylinder projectors is similar to the prior art in the fact that it is produced from layers of cylindrical material. However, the prior art does not include an important improvement of additional metallic layer between the inner diameter of the shell and outer diameter of the insulation material nor the particular angled overlapping relationship of the epoxy/graphite strips. FIG. 6 is a view of the prior art of a shell segment with no metallic liner.

The acoustic projector of the present invention is indicated generally at 1, and a first embodiment is shown in FIG. 1 with the unique features of the present invention being shown particularly in the embodiments of FIGS. 2-5. FIG. 1 shows an assembled acoustic projector having the assembled shell and driver encased in outer layer of a rubberized material 2 or other material resistant to the harsh undersea environment in which the projector will be utilized. Electrical cables 4 for supplying power to the enclosed driver are secured by a connection 6. The electrical power is connected to the driver contained therein in a usual manner well-known in the acoustic projector art. It is readily understood that projector 1, in addition to the unique shell/liner described below, will have a pair of end plates (not shown) connected together in projector 1.

In accordance with the invention as shown in FIG. 2, a shell 8 contains a driver 10. Driver 10 is well-known in the acoustic projector art and preferably is formed of piezoelectric material and is connected to electrical cable 4, and thus is not described in further detail. Shell 8 preferably is formed with a longitudinally extending slot 14 along which extends a pair of arcuate segments 16, which are secured in position along the edges of slot 14 within the interior of shell 8, by a plurality of screws 18 or other type fasteners. Segments 16 will usually be formed of a dielectric material so as to not interfere with driver 10, but could be formed of an electrically conductive material and separated from driver 10 by a layer of insulation if desired, without affecting the concept of the invention. Arcuate segments 16 assist in retaining driver 10 within shell 8. Various types of bonding adhesive or caulking material can also be used to secure driver 10 within shell 8.

In accordance with the invention, a reinforcing liner formed of metal extends generally throughout the longitudinal length of shell 8 extending along the internal diameter (ID) of the shell. Liner 20 will be formed with a longitudinally extending slot 22 which is aligned with shell slot 14. Metallic liner 20 can be formed of various materials such as aluminum, steel, titanium, brass, etc and may be separated from shell 8 by a layer of insulation (not shown). However, a layer of insulation 24 will be located between driver 10 and metallic liner 20 to electrically isolate driver 10 from the metallic liner. Liner 20 may have various thicknesses depending upon the type of material used and the dynamic range of the projector and depth to which it will be subjected to in use.

A modified metallic liner is shown in FIG. 4 and indicated at 26. Liner 26 increases in radial thickness as it extends from adjacent slot 22 toward a location near node 28, which is diametrically opposite slot 22, at which location it is thicker than adjacent slot 22. Again, liner 26 will be separated from driver 10 by insulation layer 24.

A further modification to the projector, and in particular, the shell segment thereof is shown in FIG. 5. Shell 30 is formed of a plurality of overlapping angled strips of graphite fibers encased within an epoxy. In accordance with the invention, a plurality of strips are wound in a circumferential and angular relationship to form shell 30. In one embodiment, inner and outer strips 32 and 34 respectively, are wound in a circumferential manner, that is 90° with respect to the longitudinal or Z-axis 36 of shell 30. A plurality of angled strips 38 and 40 are wound at an angular relationship with respect to axis 36, generally within the range of 45° and 85° with respect to axis 36 with the preferred angle being approximately 70°. Thus, the next layer of shell 8 will be formed with angled strip 38 extending across the longitudinal length of the shell followed by a second intermediate layer 40 wound at a generally opposite angle with respect to that of strip 38 in a generally spiral relationship across the length of shell 30. Should additional strips be desired, an intermediate strip 42 can be provided, which could extend in the same circumferential direction as are strips 32 and 34 followed by two additional strips 38 and 40 wound at their respective opposite angles in an overlapping relationship.

The particular embodiment shown in FIG. 5 is just one arrangement of using wound strips to form outer shell 30. As an example, inner strip 32 can extend in a circumferential 90° relationship with respect to axis 36 completely across the longitudinal length of the shell preferably followed by alternating oppositely angled strips 38 and 40 which are in overlapping relationship to each other and to inner strip 32, with each strip 38 and 40 extending in a wound relationship throughout the entire longitudinal length of the shell. Outer strip 34 then can be wound over intermediate strips 38 and 40 in a circumferential relationship across the entire longitudinal length of shell 30 without requiring a center strip 42 and two outermost angled strips 38 and 40 as discussed previously. Other combinations of the graphite/epoxy strips can be utilized to form a reinforcing shell having increased strength in the axial direction due to the angled relationship of the strips extending there along. Preferably, the strips will be formed of an epoxy resin embedded with longitudinally extending fibers arranged in a fiber tow, which has been found to provide for the desired strength.

FIG. 6 is a view of a prior art acoustic projector shell indicated generally at 50, which may be formed of the heretofore epoxy/graphite strips all of which were wound only in an orthogonal or circumferential hoop-like relationship with respect to the longitudinal axis of the shell as are strips 32 and 34 discussed above. Prior art shell 50 may also be formed of various types of ceramic materials. The driver 54 is mounted within the interior of shell 50 and separated therefrom by an insulation liner 56 without any internal metallic reinforcing strip as are strips 20 and 26 discussed above.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An underwater acoustic projector comprising an outer shell formed of a graphite/epoxy material including wound resin impregnated graphite strips, an inner concentric acoustic driver, and an inner concentric insulative layer, a metallic liner located between the outer shell and insulative layer, and a longitudinal slot formed in the outer shell, metallic liner and driver.

2. The projector defined in claim 1 wherein the metallic liner is selected from the group consisting of aluminum, steel, titanium, and brass.

3. The projector defined in claim 1 wherein the metallic liner is tapered and increases in radial thickness toward a location diametrically opposite the longitudinal slot.

4. The projector defined in claim 1 wherein arcuate sections of a dielectric material extend longitudinally along each side of the slot and abut the driver to assist in retaining the driver within the outer shell and metallic liner.

5. The projector defined in claim 1 wherein certain of the wound strips of the outer shell are wound at approximately 90° to a longitudinal axis of the shell and other of said strips are wound at an angle of between 45° and 85° to said longitudinal axis.

6. The projector defined in claim 5 wherein said other of said strips are wound at an angle of approximately ±70° to the longitudinal axis.

7. The projector defined in claim 1 wherein the resin impregnated graphic strips are wound in overlapping relationship, said strips include inner and outer layers wound at approximately 90° to a longitudinal axis of the shell, and a plurality of intermediate layers wound at between 45° and 85° to said longitudinal axis.

8. The projector defined in claim 7 wherein the intermediate strips alternate at ± approximately 70° to the longitudinal axis.

9. An acoustic projector comprising an outer cylindrical shell having an I.D. formed of wound resin impregnated graphite strips;

a metallic liner concentrically mounted within the shell and extending along a portion of the I.D. of the outer shell to provide structural reinforcement thereto:

a driver mounted within the metallic liner; and insulation separating the driver from the metallic liner.

10. The acoustic projector defined in claim 9 including aligned longitudinal slots found in the outer shell and metallic liner.

11. The acoustic projector defined in claim 9 including a pair of arcuate segments extending from opposite sides of the longitudinal slots within the outer shell and in edge abutment with the driver to assist in retaining the driver within the shell.

12. The acoustic projector defined in claim 9 wherein certain of the strips are wound at approximately 90° to a longitudinal axis of the shell and other of said strips being wound at an angle of between 45° and 85° to said longitudinal axis.

13. The acoustic projector defined in claim 12 wherein said other of said strips are wound at an angle of approximately ±70° to the longitudinal axis.

14. The acoustic projector defined in claim 12 wherein the resin impregnated graphite strips of the outer shell are wound in overlapping relationship, said strips include inner and outer layers wound at approximately 90° to a longitudinal axis of the shell, and a plurality of intermediate layers wound at between 45° and 85°± to said longitudinal axis.

15. The acoustic projector defined in claim 14 wherein the intermediate strips alternate at ±approximately 70° to the longitudinal axis.

* * * * *